United States Patent [19]

Shibata et al.

[11] Patent Number: 5,053,644
[45] Date of Patent: Oct. 1, 1991

[54] SEMICONDUCTOR INTEGRATED CIRCUIT

[75] Inventors: Manabu Shibata; Akira Uragami, both of Takasaki; Shinji Kadono; Yukio Suzuki, both of Tokyo, all of Japan

[73] Assignee: Hitachi, Ltd., Tokyo, Japan

[21] Appl. No.: 863,721

[22] Filed: May 16, 1986

[30] Foreign Application Priority Data

May 17, 1985 [JP] Japan .................................. 60-103728

[51] Int. Cl.$^5$ ...................... H03K 19/02; H03K 17/16
[52] U.S. Cl. .................................... 307/446; 307/465; 307/465.1; 307/475; 307/264; 307/303.2; 307/290; 307/547; 307/570
[58] Field of Search ............... 307/443, 446, 451, 465, 307/468, 469, 475, 264, 562, 547, 570, 270, 279, 290, 465.1, 303.1–303.2

[56] References Cited

U.S. PATENT DOCUMENTS 3,801,831  4/1974  Dame .................................. 307/264
4,506,168  3/1985  Uya .................................... 307/290

FOREIGN PATENT DOCUMENTS 2373921   8/1978  France ............................... 307/475
0099100   1/1984  Japan ................................. 307/570
0125504  11/1984  Japan ................................. 357/45
60-37820  3/1985  Japan .
0172350   2/1986  Japan ................................. 307/475

Primary Examiner—S. D. Miller
Assistant Examiner—Margaret Rose Wambach
Attorney, Agent, or Firm—Antonelli, Terry, Stout & Kraus

[57] ABSTRACT

A semiconductor integrated circuit is so designed that it is possible to form any one of the three different kinds of circuit configuration, that is, an inverter circuit, a Schmitt circuit and a common-mode circuit, as desired, by employing circuit elements prepared in advance and by changing wiring. Also disclosed is a semiconductor integrated circuit having these circuit configurations. The output stage of any one of the three kinds of circuit is constituted by a bipolar transistor, and the other portions are constituted by MOS field-effect transistors.

9 Claims, 8 Drawing Sheets

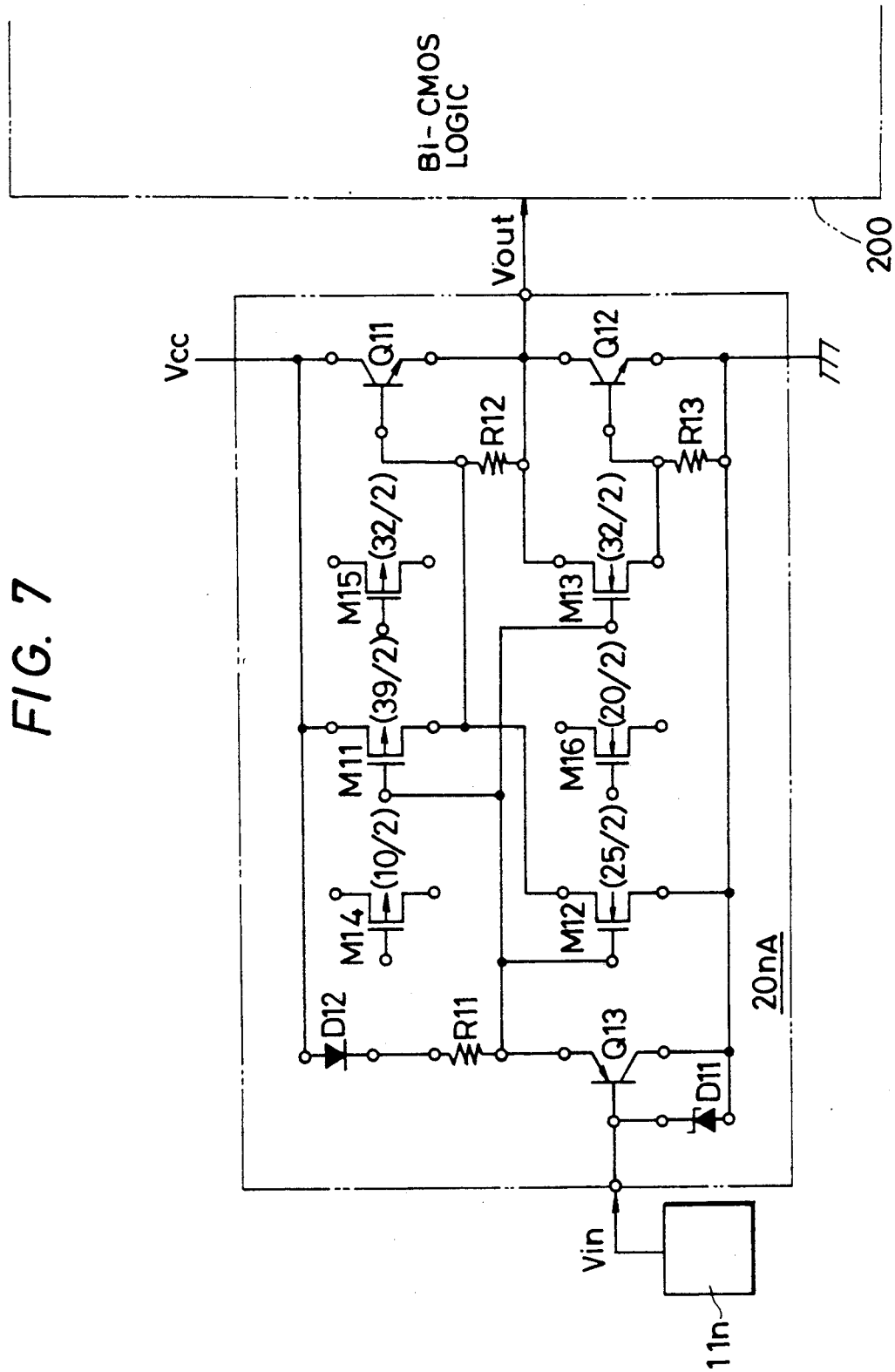

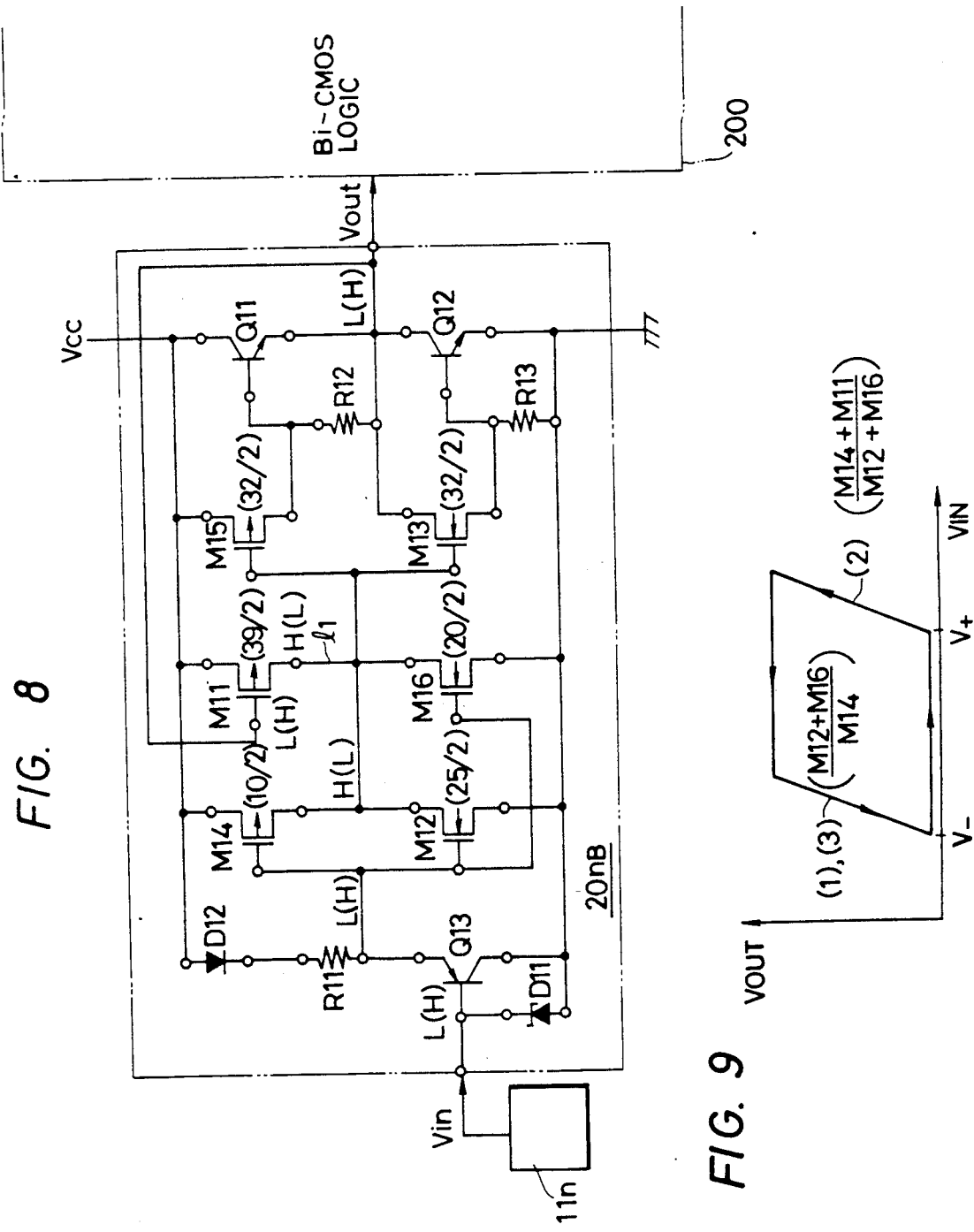

SEMICONDUCTOR INTEGRATED CIRCUIT

BACKGROUND OF THE INVENTION

The present invention relates to a semiconductor integrated circuit (IC). More particularly, the present invention pertains to a technique which may be effectively employed in an input/output buffer of a gate array IC which is one type of semi-custom IC.

A gate array IC includes an internal circuit section in which a multiplicity of basic cells are arranged, and a multiplicity of buffer sections disposed around the internal circuit section.

Each basic cell is composed of circuit elements required to constitute a basic logic circuit, e.g., an MOS field-effect transistor and a resistor, which are formed in a semiconductor substrate. Provision of a multiplicity of such basic cells enables various kinds of circuits or systems to be formed relatively readily and at reduced costs in accordance with the orders placed by individual customers simply by changing wiring patterns.

Each buffer section is composed of a pair of circuit elements, one of them constituting an input buffer circuit, and the other constituting an output buffer circuit. Either the input or output buffer circuit is selectively formed in accordance with the type of circuit of system formed in the internal circuit section.

Hitachi Ltd. has already developed a Bi-CMOS gate array IC capable of effecting high-speed signal processing at reduced power consumption. In this gate array IC, a complex switching circuit of a CMOS element and a bipolar element is employed, such as that shown in, e.g., A. Uragami et al—U.S. patent application Ser. No. 704,209.

The present inventors made various efforts to improve the performance of this Bi-CMOS gate array IC and have discovered the following points.

The buffer section has a signal voltage level converting function for converting a TTL (Transistor Transistor Logic) or ECL (Emitter Coupled Logic) level signal to a CMOS level signal. This input/output buffer circuit is basically designed to serve as an inverter circuit, and no consideration has heretofore been taken to arranging the input/output buffer so that it can form other kinds of logic circuits in accordance with the input conditions of an input signal.

It is often experienced that the waveform of a signal input to a gate array IC is distorted by transmission through a relatively long communication line. It has also been found that various kinds of noise are superposed on the input signal. The present inventors have revealed that, when such an input signal is received, it is necessary to employ, as an input buffer circuit, a circuit which has a wave-shaping function and which is not easily affected by any noise, such as a Schmitt trigger circuit.

In addition, there are cases when it is desired not only to invert an input signal and transmit the inverted signal to an internal logic but also to obtain a signal which is in phase with an input signal, as an input buffer output. In such a case, the inventors determined, prior to accomplishing the present invention, that an inverter circuit which is formed by employing a basic cell in the internal circuit section can be connected to the output end of an inverter type input buffer circuit, thereby obtaining an in-phase output. This arrangement, however, reduces the number of basic cells which can be used in the internal circuit section. The present inventors have also found that, when an input buffer section and an internal circuit section are spaced apart from each other by a relatively long distance, the delay in transmission of an input signal between two inverter circuits becomes undesirably large. Thus, the restriction on the kinds of available input buffer circuits is one of the primary causes which limit the range within which the gate array IC can be used. The above matters have been clarified by the inventors through their studies.

SUMMARY OF THE INVENTION

A representation of the present invention disclosed in this application will be summarized as follows.

Some additional circuit elements are provided in a buffer section which includes basic circuit elements necessary to form an ordinary inverter-type input buffer circuit in, for example, a gate array IC, so that it is possible to form, according to need, a common-mode type input buffer circuit or a Schmitt type input buffer circuit using these additional circuit elements.

A common-mode or in-phase buffer circuit for delivering an output which is in phase with an input signal or a Schmitt trigger circuit having a wave-shaping function has a circuit configuration which eliminates useless elements as much as possible and which enables such a circuit to be formed by a minimal number of elements. In addition, the common-mode buffer circuit or Schmitt trigger circuit has a high-performance circuit configuration which makes use of the merit (e.g., a relatively small output impedance) of a bipolar-CMOS complex circuit.

As described above, a larger variety of input buffer circuits becomes available due to the present invention, and it is correspondingly possible to enlarge the range within which the gate array IC can be used.

BRIEF DESCRIPTION OF THE DRAWINGS

FIG. 7 is a circuit diagram of an inverter-type input buffer circuit;

FIG. 8 is a circuit diagram of a Schmitt trigger type input buffer circuit;

FIG. 9 is a characteristic chart showing the relationship between the input $V_{IN}$ and the output $V_{OUT}$ in the Schmitt trigger circuit illustrated in FIG. 8.

DESCRIPTION OF THE PREFERRED-EMBODIMENTS

The present invention will be described hereinunder with reference to the accompanying drawings.

Figure 1:
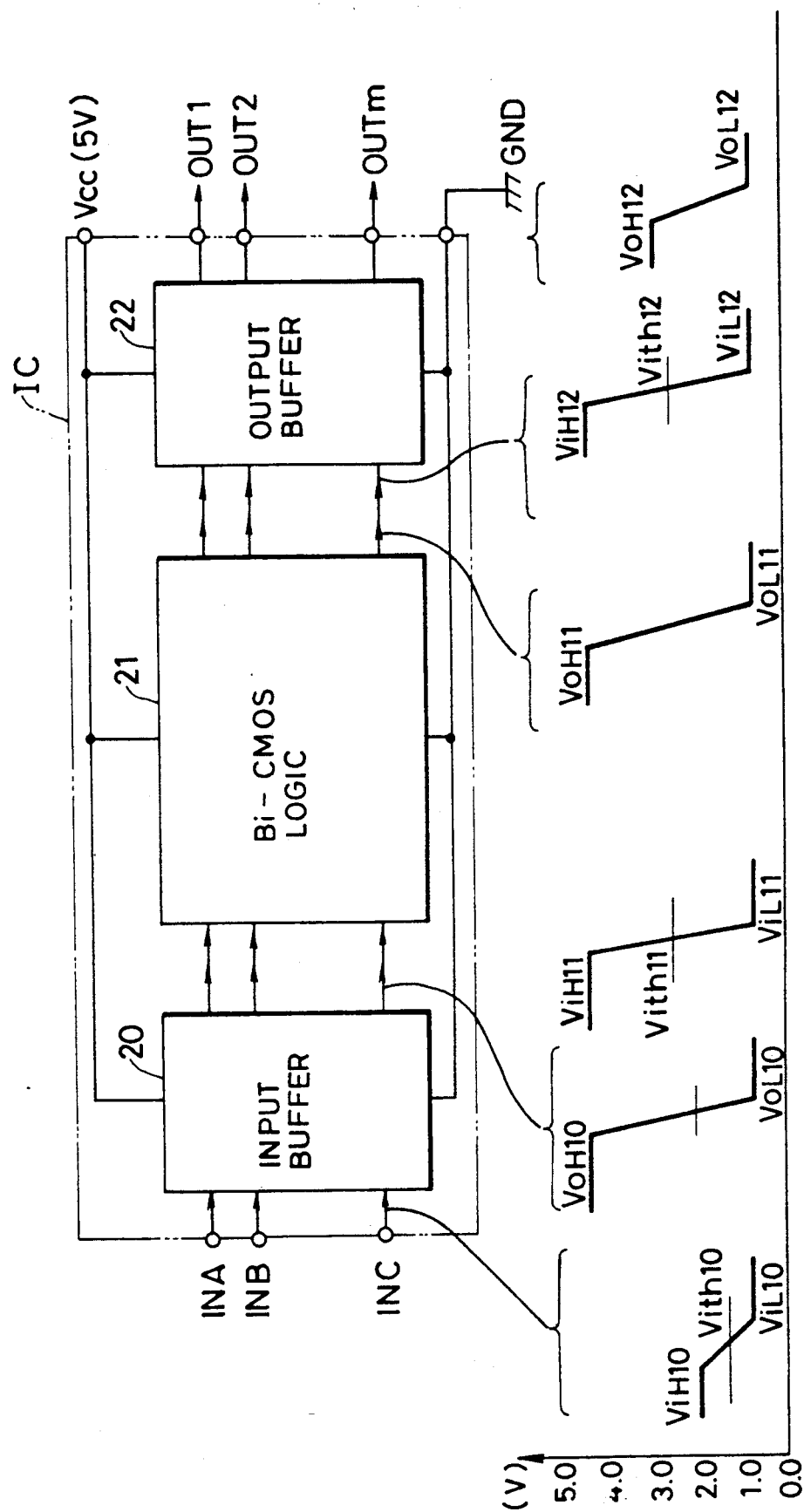
FIG. 1 shows a system configuration of a Bi-CMOS gate array IC, together with signal levels at various sections therein.

FIG. 1 shows a general system configuration of a gate array IC in accordance with one embodiment or the present invention, together with signal levels at various sections therein. As will be clear from FIG. 1, this IC comprises an input buffer 20, a Bi-CMOS logic 21 composed of CMOSs as main components, and an output buffer 22. The input buffer 20 has a level converting function (it may also have a logic operation function according to need). The input buffer 20 converts, for example, TTL level input signals $IN_A$, $IN_B$ and $IN_C$, which are input from the outside, into CMOS level signals, which are in turn input to the Bi-CMOS logic 21. The output buffer 22 has a level converting function (it may also have a logic operation function according to need) for converting CMOS level signals into, for example, TTL level signals. The output buffer 22 eventually outputs, for example, TTL level output signals OUT1, OUT2 . . . OUTm.

Figure 2:
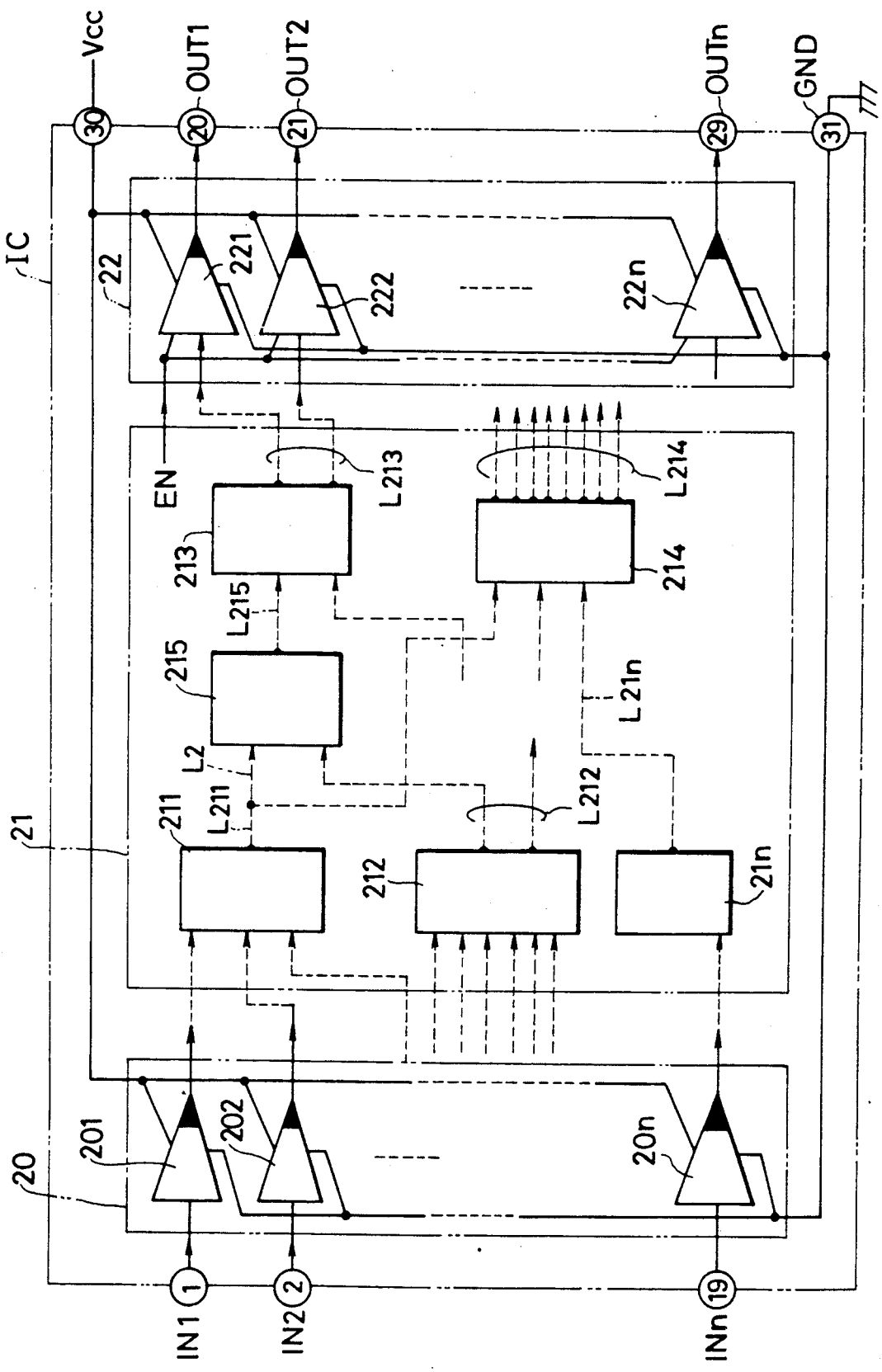
FIG. 2 is a block diagram which shows more practically the system configuration of the gate array IC illustrated in FIG. 1.

FIG. 2 shows more practically the internal arrangement of the system illustrated in FIG. 1. In FIG. 2, the reference numerals 211 to 21n in the logic denote unit cells (macrocells), respectively, and each of the blackened pointed end portions shows an output-stage circuit which is constituted by a bipolar circuit (the other portions are constituted by CMOS elements of low-power consumption). A unit cell (macrocell) is a logic function block constituted by a plurality of logic elements (each of which is a minimum unit constituting a logic circuit and which is a single logic function block which cannot be divided into smaller portions), e.g., a multiplexer or a flip-flop. Wiring of the interior of each unit cell is done by an IC manufacturer, and wiring between unit cells is effected in accordance with a user's specification. It should be noted that the disposition of unit cells and wiring are carried out by employing DA (Design Automation).

Figure 3A:
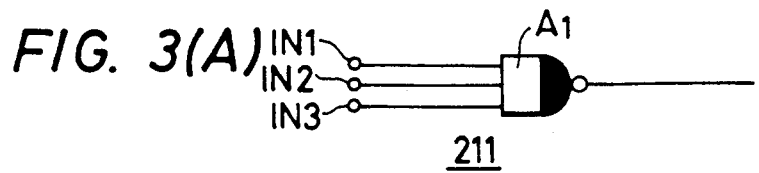
FIG. 3(A) is a logic symbol (3-input NAND) chart showing the logic function of the circuit block 211 illustrated in FIG. 2.
Figure 3B:
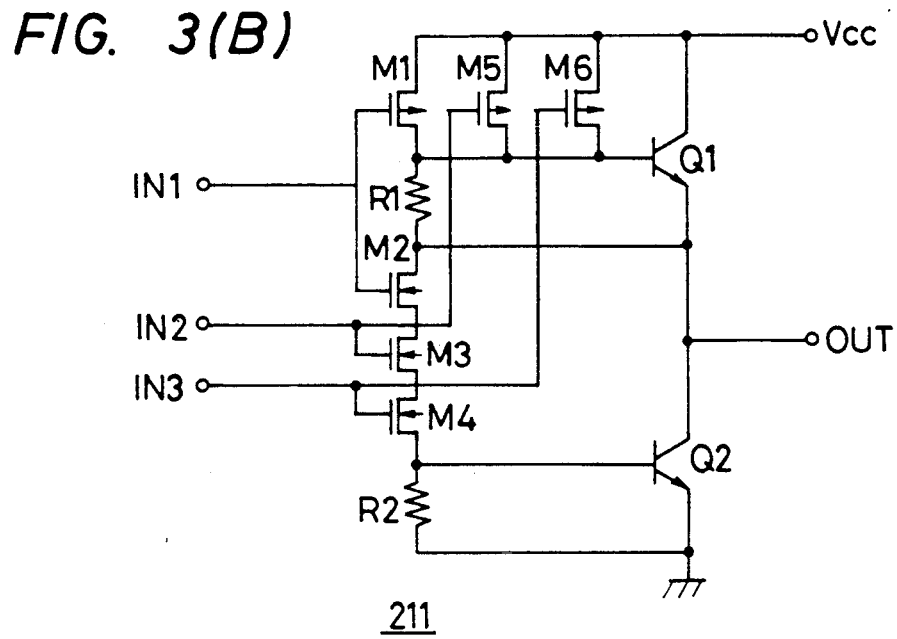
FIG. 3(B) is a circuit diagram showing a practical circuit configuration of the 3-input NAND circuit illustrated in FIG. 3(A)

As described above, each of the output gates of the unit cells 211 to 21n, the input buffers 201 to 20n and the output buffers 221 to 22m is a high-load driven gate constituted by a bipolar circuit. Therefore, the signal delay can be made substantially equal to a relatively small signal delay of an internal gate regardless of, for example, the length of the wiring connecting unit cells or the magnitude of load, so that the degree of design freedom is considerably improved. The block 211 in the internal logic section shown in FIG. 2 can have an arrangement, such as the one which is shown in FIGS. 3(A) and 3(B). FIG. 3(A) shows a logic symbol of the block 211, and FIG. 3(B) shows a practical circuit configuration of the block 211.

Figure 5B:
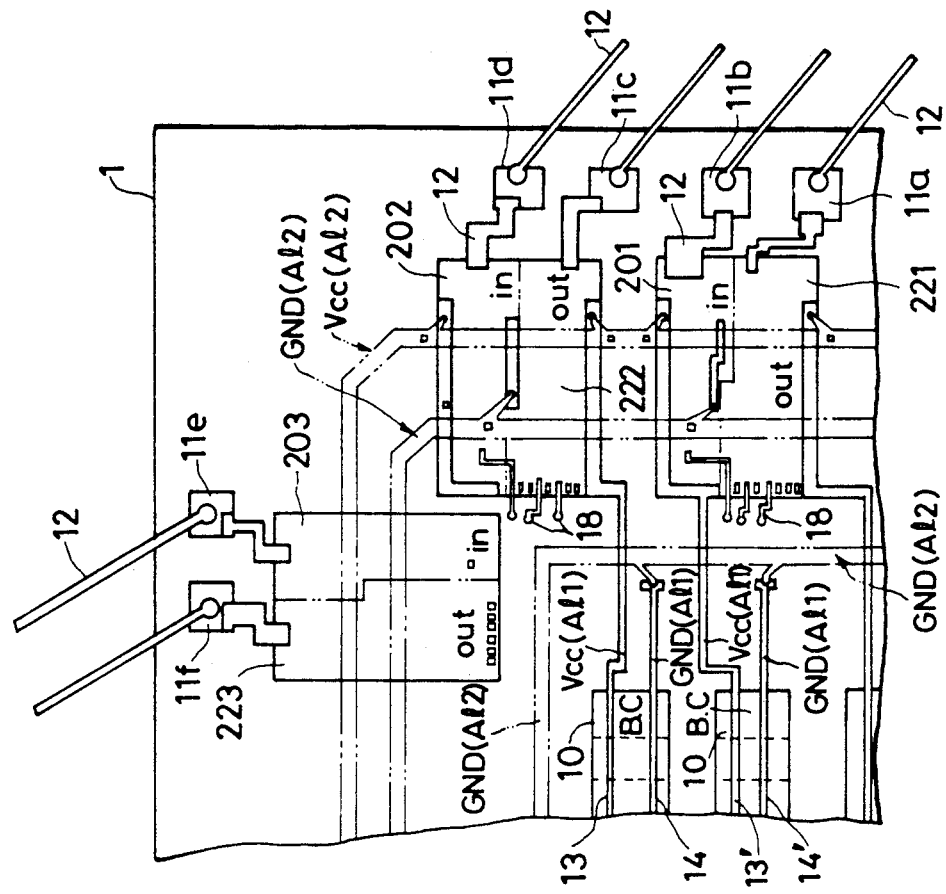
FIG. 5(b) shows more practically the layout in plan of a portion A surrounded by the chain line in FIG. 5(a)
Figure 5A:
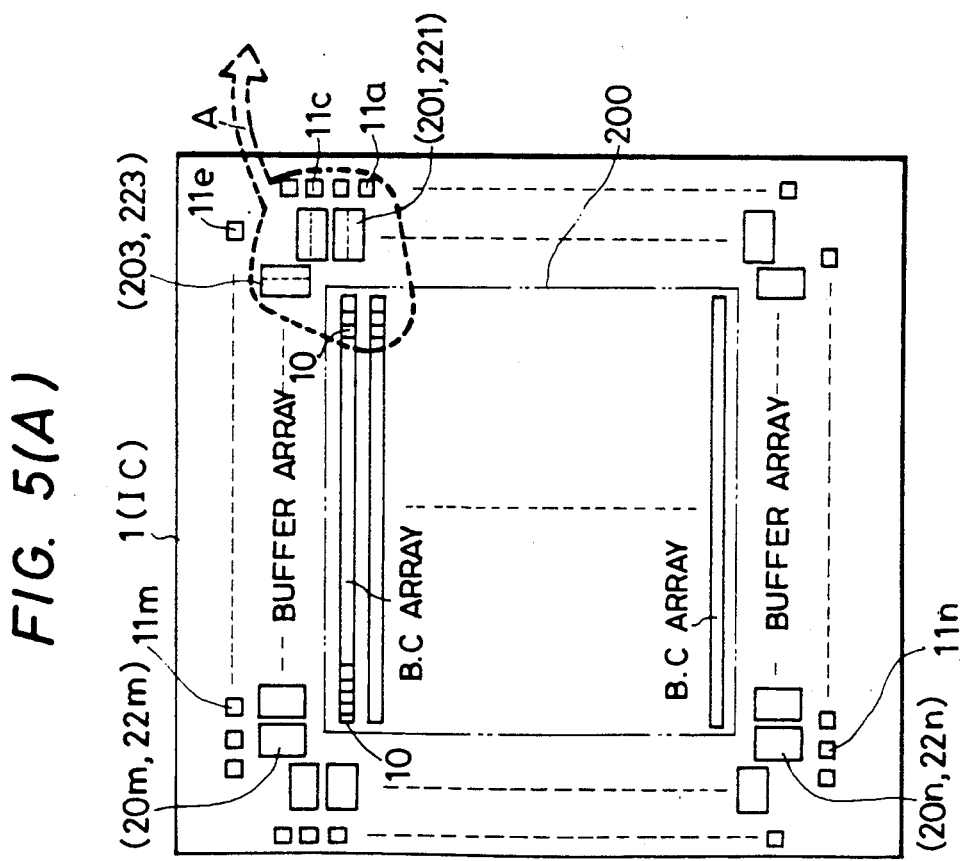
FIG. 5(a) shows a layout in plan of the Bi-CMOS gate array IC in the form of a silicon chip.

The following is a description of the plan layout of the IC (gate array), shown in FIGS. 1 and 2, in a silicon chip 1, with reference to FIGS. 5(a) and 5(b). As shown in FIG. 5(a), arrays of Bi-CMOS cells (basic cells) 10 are regularly arranged inside the chip 1, and the input and output buffers 20n and 22n are arranged around the arrays. In addition, bonding pads 11 are arranged along the outermost periphery of the chip 1.

FIG. 5(b) shows more practically the plan layout of a portion A surrounded by the chain line in FIG. 5(a). Bonding wires 12 are respectively connected to the pads 11. The pads 11 and the input and output buffers (20n, 22n) are connected by Al wirings 12 which define a first layer of the multi-layer wiring. Power supply ($V_{cc}$) and grounding (GND) lines, which are constituted by Al lines defining a second layer, are laid above the input and output buffers (20n, 22n). These lines are connected to the first-layer Al wiring through through-holes and grounding lines, thus laying $V_{cc}$ lines 13 and GND lines 14 which are common to the input and output buffers (20n, 22n) and the basic cell arrays 10.

Figure 4:
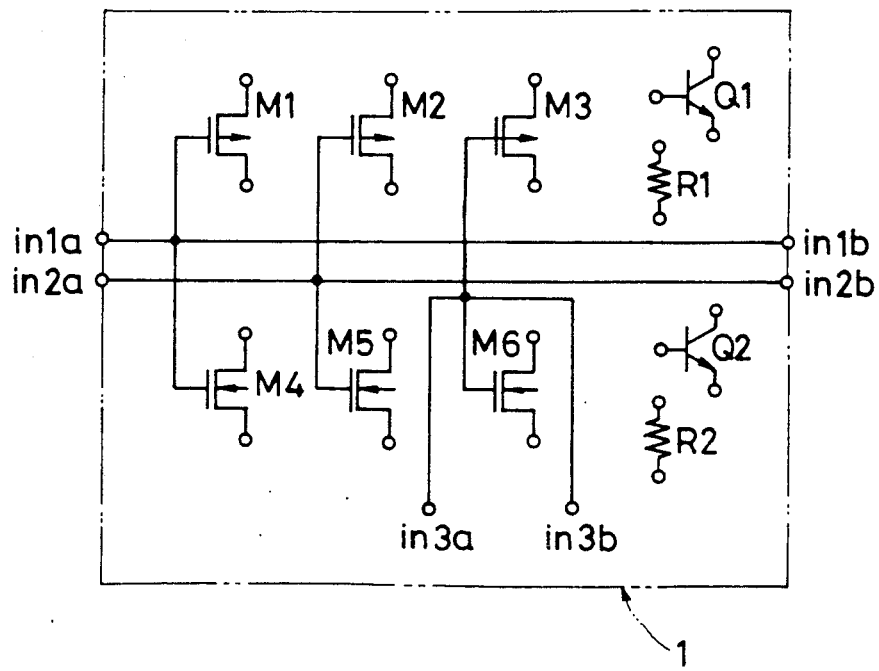
FIG. 4 shows circuit elements provided within a basic cell (B.C) in the Bi-CMOS gate array IC, together with the arrangement thereof.

FIG. 4 shows the contents of one of the above-described basic cells (B.C.) 10.

Circuit elements for constituting a basic logic circuit are formed in the basic cell 10. Formed in the basic cell 10 is a semiconductor substrate which constitutes a part of or the whole of the following circuit elements: P-channel MOS field-effect transistors M1, M2, M3, N-channel MOS field-effect transistors M4, M5, M6, resistors R1, R2 and bipolar transistors Q1, Q2. In this case, the MOS field-effect transistors M1 to M6 are used to constitute a pre-stage C-MOS logic circuit, and the bipolar transistors Q1, Q2 have their emitter-collector paths connected in series and are used to constitute an output-stage circuit. Thus, it is possible to form a circuit which simultaneously enables the power consumption to be reduced, the input impedance to be increased, and the output impedance to be decreased.

The reference symbols in1a, in1b, in2a, in2b, in3a and in3b respectively denote cell terminals which are used to connect this cell 10 to another cell.

The input buffer circuit 20n, which constitutes an essential part of the present invention, will next be explained.

Figure 6:
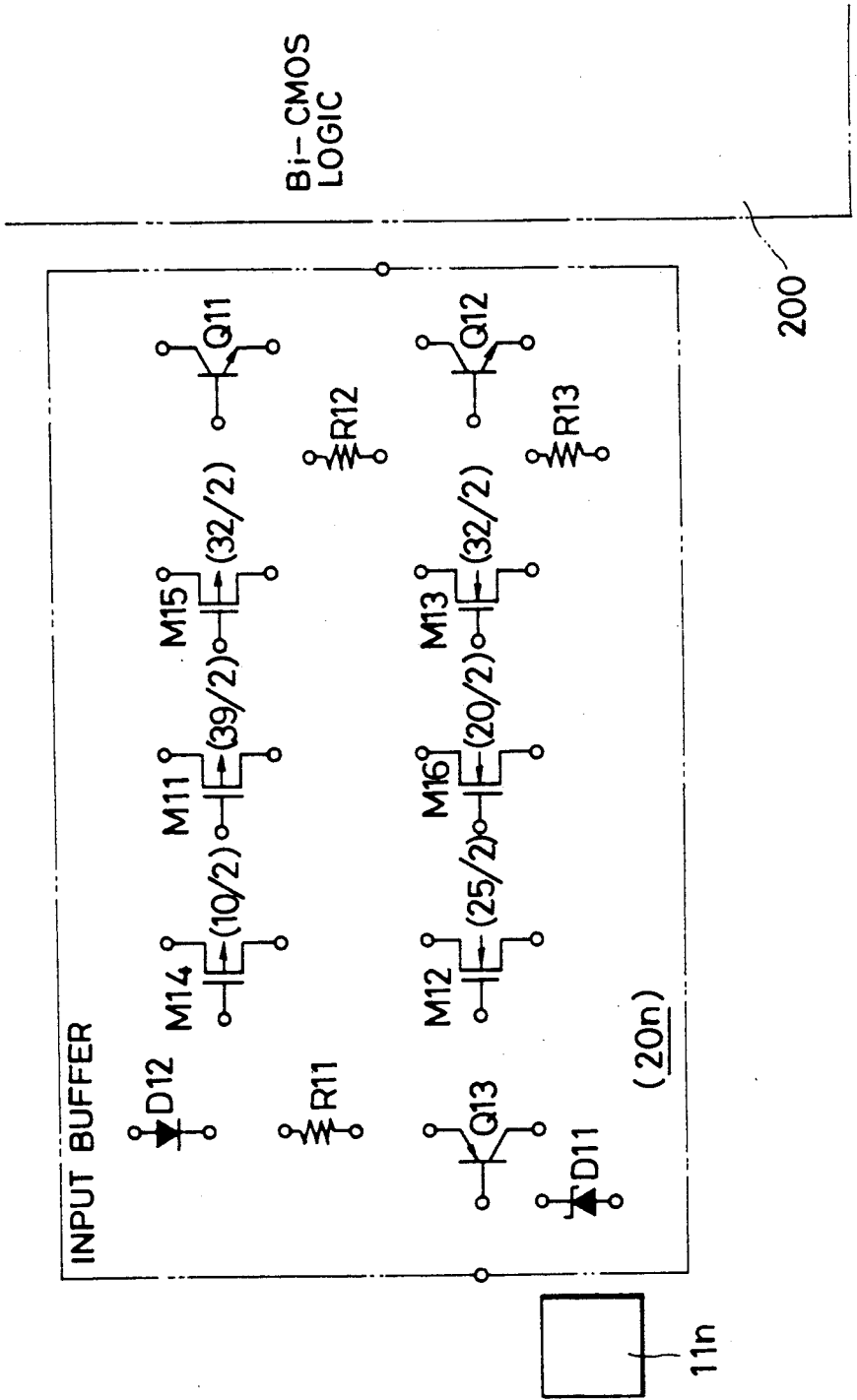
FIG. 6 shows circuit elements provided within an input buffer section in the Bi-CMOS gate array IC, together with the arrangement thereof.

FIG. 6 shows an arrangement of elements formed in the above-described buffer 20n. In this region are formed basic circuit elements necessary to form an ordinary inverter type input buffer circuit, together with some additional circuit elements. Employment of these additional circuit elements enables any one of the inverter type, common-mode or in-phase type and Schmitt type input buffer circuits to be formed according to need.

As basic circuit elements required to form an ordinary inverter type input buffer circuit, there are provided a P-channel MOS field-effect transistor M11, N-channel MOS field-effect transistors M12, M13, bipolar transistors Q11, Q12, Q13, diodes D11, D12 and resistors R11, R12, R13. In addition to these elements, three MOS field-effect transistors M14, M15, M16 are provided.

It should be noted that the numerals (10/2), (25/2), (39/2) and (32/2), which are respectively located adjacent to the MOS field-effect transistors M11 to M16, show examples of the ratio of the gate width W to the channel length L (W/L) of each of the MOS field-effect transistors.

FIG. 7 shows an ordinary inverter type input buffer circuit 20nA formed by employing the above-described circuit elements. In this case, the basic circuit elements (M11, M12, M13, R11, R12, R13, D11, Q11, Q12, Q13) are used to form the inverter type input buffer circuit 20nA. The bipolar transistor Q13 is used in the input stage, while the bipolar transistors Q11, Q12 are used in the output stage, and the MOS field-effect transistors M11, M12, M13 are used in the stage therebetween. Thus, it is possible to reduce the power consumption, increase the input impedance and decrease the output impedance.

The reason why the input impedance is increased by the common collector PNP transistor Q13 disposed in the input stage is to prevent the breakdown of the gates of the MOS field-effect transistors by static electricity or the like.

FIG. 8 shows a Schmitt type inverter circuit $20nB$ formed by employing the above-described circuit elements. In this circuit, the additionally provided MOS field-effect transistors M14, M15 and M16 are also used in addition to the basic circuit elements (M11, M12, M13, R11, R12, R13, D11, Q11, Q12 and Q13).

As shown in FIG. 8, an input signal ($V_{IN}$) is input through the base-emitter path of the common collector PNP transistor Q13 to a CMOS inverter which is constituted by the P-channel MOS field-effect transistor M14 and the N-channel MOS field-effect transistors M12, M16. The output of this CMOS inverter is supplied to the respective gates of the P-channel MOS field-effect transistor M15 and the N-channel MOS field-effect transistor M13. The MOS field-effect transistors M15 and M13 become conductive in complementary relation to each other and drive the bipolar transistors Q11 and Q12 in the output stage in a complementary manner. The drain of the positive feedback transistor M11 is connected to the output end 11 of a CMOS inverter which is constituted by the MOS field-effect transistors M14 and M12. The output voltage from the above-described output stage is positive-fed back to the gate of the MOS field-effect transistor M11. The existence of this positive feedback loop enables a function such as a Shimitt circuit to be accomplished. In this case, the positive-feedback voltage is given by the bipolar transistors Q11 and Q12 having high driving power, so that stable positive feedback is constantly effected independently of the conditions of a load connected to the output end of this Schmitt circuit. Thus, it is possible to obtain a Schmitt circuit having minimized Schmitt width fluctuations.

The operation of the Schmitt circuit will be explained below in more detail and in due order.

(1) When the input $V_{IN}$ shifts to an L level (e.g., 0.8 V):

The emitter of the input-stage bipolar transistor Q13 also shifts to the L level, and the output of the CMOS inverter constituted by the MOS field-effect transistors M14, M12 and M16 shifts to an H level. As a result, the MOS field-effect transistor M13 turns ON, and the output-stage bipolar transistor Q12 turns ON, so that the output $V_{OUT}$ becomes substantially equal to the emitter-collector saturated voltage $V_{CEsatQ12}$ (substantially equal to the GND level) of the transistor Q12. In other words, the output $V_{OUT}$ shifts to the L level. In consequence, the L-level output voltage is applied to the gate of the positive feedback transistor M11 through the positive feedback loop, causing the transistors M11 to turn ON, and the drain (line 11) thereof is fixed at the H level. It is to be noted that, in this state, the MOS field-effect transistors M14 and M11 are ON. For facilitating understanding, voltage levels at various portions or sections are shown in FIG. 8. The voltage levels in parentheses are those at the various portions in the following case (2).

(2) When the input $V_{IN}$ gradually shifts from the L level to an H level (e.g., 2.8 V):, The emitter of the input-stage PNP bipolar transistor Q13 shifts to the H level. As a result, MOS field-effect transistors M12 and M16 turn ON. The timing at which these two transistors M12 and M16 turn ON is determined by the channel conductance ratio (W/L) between the two MOS field-effect transistors M14, M11, which are ON in the state of (1), and the MOS field-effect transistors M12, M16.

When the MOS field-effect transistors M12, M16 turn ON, the output-stage MOS field-effect transistor M15 and the output-stage bipolar transistor Q11 turn ON as a consequence, so that the output $V_{OUT}$ shifts to the H level. As a result, the positive feedback transistor M11 turns OFF. It is to be noted that, in this state, the two MOS field-effect transistors M12, M16 are ON, and the positive feedback transistor M11 is OFF.

(3) When the input $V_{IN}$ shifts from the H level to the L level:

In this case, the same operation as that described in (1) is repeated. The timing at which the output of the CMOS inverter constituted by the MOS field-effect transistors M14, M12 and M16 shifts to the H level, that is, the timing at which the MOS field-effect transistors M12 and M16 which have been ON turn OFF and the MOS field-effect transistor M14 turns ON instead, is determined by the channel conductance ratio (W/L) between the MOS field-effect transistor M14 and the MOS field-effect transistors M12, M16. When the MOS field-effect transistor M14 turns ON, the output $V_{OUT}$ shifts to the L level by the operation described in (1).

FIG. 9 shows a curve (hysteresis curve) representing the relationship between the input $V_{IN}$ and output $V_{OUT}$ obtained by the above-described operation. The operations respectively described in (1) and (3) correspond to the fall of the curve shown in FIG. 9, and the operation in the case of (2) corresponds to the rise of the curve. As illustrated, the fall timing of the output $V_{OUT}$ is determined by the conductance ratio of the MOS field-effect transistors M12, M16 to the MOS field-effect transistor M14

$$\left(\text{see } \frac{M12 + M16}{M14} \text{ in FIG. 9}\right).$$

The rise timing is determined by the conductance ratio of the MOS field-effect transistors M14, M11 to the MOS field-effect transistors M12, M16

$$\left(\text{see } \frac{M14 + M11}{M12 + M16} \text{ in FIG. 9}\right).$$

In this way, hysteresis characteristics can be obtained.

It is to be noted here that the feedback signal ($V_{OUT}$) applied to the gate of the positive feedback transistor M11 is a signal output from the output-stage bipolar transistors Q11 and Q12 and presents an extremely low output impedance. In consequence, it is possible for the output $V_{OUT}$ to follow any change in the input $V_{IN}$ accurately and speedily. As a result, it is possible to minimize, particularly, alternating Schmitt width fluctuations. The Schmitt width means the distance between V− and V+ in the graph shown in FIG. 9.

In the circuit shown in FIG. 8, the ratio (W/L) of each of the MOS field-effect transistors is set so that the same input threshold characteristics as those of the circuit shown in FIG. 7 are obtained.

Figure 10:
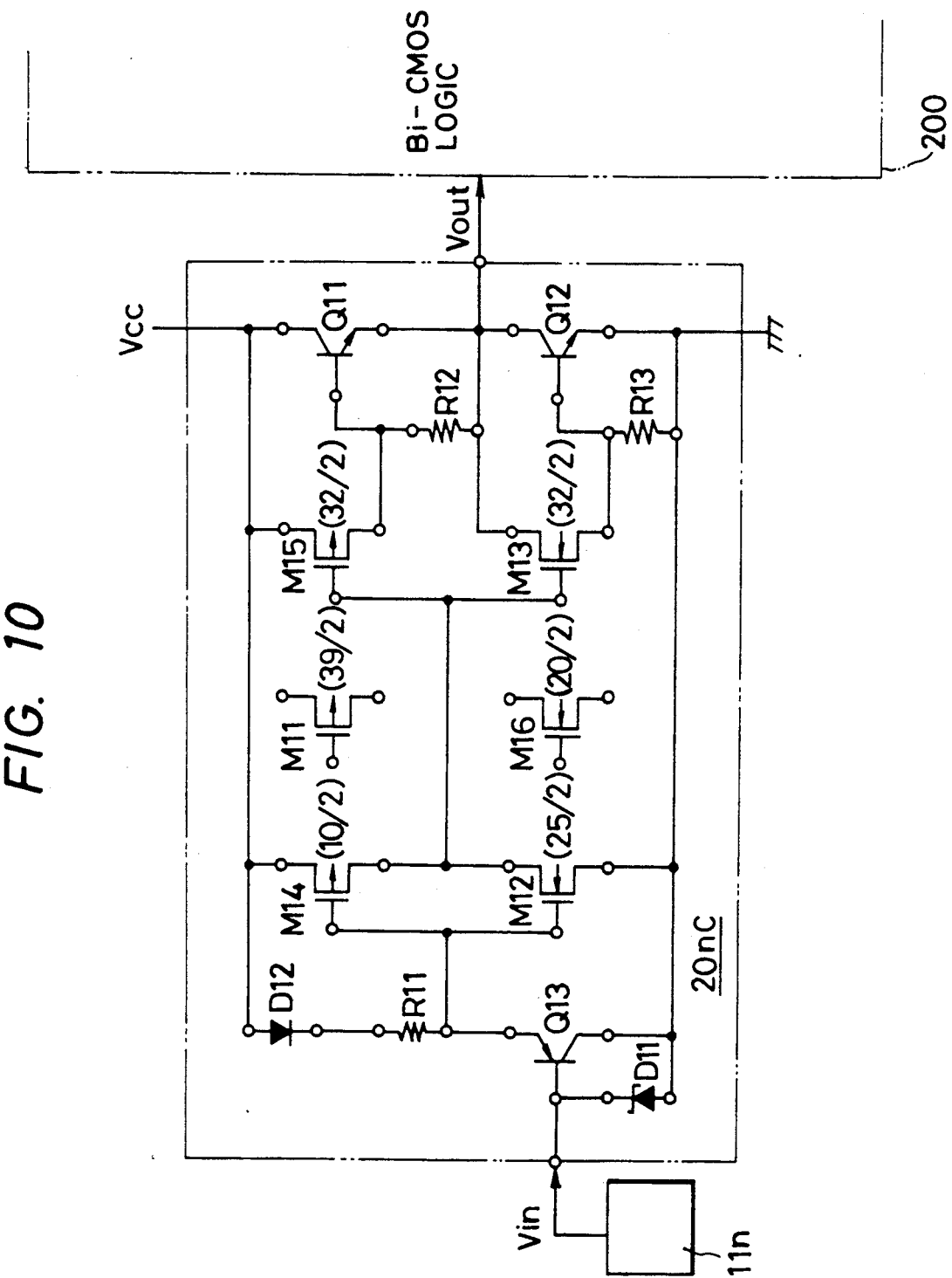
FIG. 10 is a circuit diagram of a common-mode output circuit type input buffer.

FIG. 10 shows a common-mode or in-phase (slew) type inverter circuit $20nc$ formed by employing the above-described circuit elements. In this case, the additionally provided MOS field-effect transistor M14 is used in addition to the basic circuit elements (M11, M12, M13, R11, R12, R13, D11, Q11, Q12 and Q13).

In the illustrated example, an inverter is constituted by the MOS field-effect transistors M14 and M12, and this inverter is interposed between an input stage and an output stage, thereby forming an input buffer circuit which transmits an input signal in the form of a signal which is in phase with it.

It should be noted that the circuit shown in FIG. 10 is also arranged so as to obtain the same input threshold characteristics as those of the circuit shown in FIG. 7.

As described above, it is possible to readily form either a common-mode or Schmitt type input buffer circuit in accordance with the order placed by each individual customer, in addition to an ordinary inverter type input buffer circuit, simply by providing some additional circuit elements, together with basic circuit elements required to form an ordinary inverter type input buffer circuit. Thus, it is possible to increase the number of kinds of available input buffer circuits and enlarge the range within which the gate array IC can be used.

It should be noted that, when it is only necessary to arrange a gate array IC so that either an inverter type input buffer circuit shown in FIG. 7 or common-mode type input buffer circuit shown in FIG. 10 can be formed, it suffices to provide only one MOS field-effect transistor M14 as an additional circuit element.

As has been described above, the present invention offers the following advantages. It is possible to readily form either a common-mode or Schmitt type input buffer circuit in accordance with the order placed by each individual customer, in addition to an inverter type input buffer circuit, by providing some additional circuit elements, together with basic circuit elements required to form an ordinary inverter type input buffer circuit. Thus, it is possible to increase the number of kinds of available input buffer circuit and enlarge the range within which the gate array IC can be used.

Although the invention accomplished by the present inventors has been described by way of an example in which it is applied to a technique for forming an input buffer of a gate array IC that is a field on which the present invention is based, it is a matter of course that the present invention may be applied to an output buffer. In addition, the present invention is not necessarily limited to gate array ICs and may be applied to other semiconductor integrated circuits, e.g., one which includes an analog circuit.

What is claimed is:

1. An integrated circuit device comprising:
   a substrate having one main surface;
   a plurality of bonding pads formed on said main surface;
   a plurality of buffer regions formed on said main surface, each buffer region having predetermined elements which include n- and p-channel MOSFETs and at least one bipolar transistor;
   a plurality of input circuits formed at said plurality of buffer regions by electrically connecting selected elements among said predetermined elements in said plurality of buffer regions, each input circuit having an input coupled to one of said plurality of bonding pads, an output and a predetermined signal transmission function which is provided by said selected elements between said input and output thereof, wherein said predetermined signal transmission function is a selected one of an inverter function, a common mode function and a hysteresis function; and
   an internal circuit disposed on said main surface in such a manner as to receive at input terminals thereof output signals from said outputs of said plurality of input circuits.

2. An integrated circuit according to claim 1, wherein said internal circuit includes a plurality of gates, and wherein at least one of said plurality of gates has an input stage comprised of n- and p-channel MOSFETs and an output stage comprised of NPN bipolar output transistors.

3. An integrated circuit according to claim 1, wherein each of said plurality of input circuits includes an input stage comprised of at least two n-channel MOSFETs and at least one p-channel MOSFET, and an output stage comprised of said at least one bipolar transistor.

4. An integrated circuit according to claim 3, wherein in the input circuit having said hysteresis function an emitter of said bipolar output transistor is coupled to a gate of said at least one p-channel MOSFET.

5. An integrated circuit according to claim 1, wherein each of said plurality of input circuits further comprises a PNP input bipolar transistor for receiving an external input signal at said input thereof.

6. An integrated circuit according to claim 1, wherein each of said plurality of input circuits includes a level converting function to provide a CMOS level output signal at said output thereof in response to an external input signal having a level different than said CMOS level which is received at said input thereof.

7. An integrated circuit device comprising:
   a substrate having one main surface;
   a plurality of bonding pads formed on said main surface;
   a plurality of buffer regions formed on said main surface, each buffer region having a first group of elements which include n- and p-channel MOSFETs and bipolar transistors, and a second group of elements which include n- and p-channel MOSFETs;
   a plurality of input circuits formed at said plurality of buffer regions by electrically connecting selected elements among said first and second groups of elements in said plurality of buffer regions, each input circuit having an input coupled to one of said plurality of bonding pads, an output and a predetermined signal transmission function which is provided by said selected elements between said input and output thereof, wherein said predetermined signal transmission function is a selected one of an inverter function, a common mode function and a hysteresis function; and
   an internal circuit disposed on said main surface in such a manner as to receive at input terminals thereof output signals from said outputs of said plurality of input circuits,
   wherein the input circuit having said inverter function is constructed by said first group of elements, wherein the input circuit having said common mode function is constructed by elements selected from said first and second groups of elements, and wherein the input circuit having said hysteresis function is constructed by both said first and second groups of elements.

8. An integrated circuit according to claim 7, wherein said internal circuit includes a plurality of gates, and wherein at least one of said plurality of gates has an input stage comprised of n- and p-channel MOSFETs and an output stage comprised of NPN bipolar output transistors.

9. An integrated circuit according to claim 7, wherein each of said plurality of input circuits includes an input stage, an output stage and an intermediate stage disposed between said input and output stages, wherein said bipolar transistors of said first group of elements include an input bipolar transistor for said input stage of each input circuit and output bipolar transistors for said output stage of each input circuit, wherein said n- and p-channel MOSFETs of said first group of elements and said n- and p-channel MOSFETs of said second group of elements are for said intermediate stage.

* * * * *